(12) United States Patent
Shimada et al.

(10) Patent No.: US 10,002,813 B2
(45) Date of Patent: Jun. 19, 2018

(54) ADHESIVE COMPOSITION AND ADHESIVE SHEET, AND HARDENED ARTICLE AND SEMICONDUCTOR DEVICE USING SAME

(71) Applicant: TORAY INDUSTRIES, INC., Tokyo (JP)

(72) Inventors: Akira Shimada, Otsu (JP); Koichi Aoki, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 331 days.

(21) Appl. No.: 14/650,594

(22) PCT Filed: Jan. 16, 2014

(86) PCT No.: PCT/JP2014/050684
§ 371 (c)(1),
(2) Date: Jun. 9, 2015

(87) PCT Pub. No.: WO2014/115637
PCT Pub. Date: Jul. 31, 2014

(65) Prior Publication Data
US 2015/0318227 A1    Nov. 5, 2015

(30) Foreign Application Priority Data

Jan. 22, 2013 (JP) ................... 2013-008995

(51) Int. Cl.
| | |
|---|---|
| *C09J 179/08* | (2006.01) |
| *H01L 23/29* | (2006.01) |
| *H01L 23/495* | (2006.01) |
| *C09J 163/00* | (2006.01) |
| *C08G 59/40* | (2006.01) |
| *C09J 9/00* | (2006.01) |
| *H01L 23/373* | (2006.01) |
| *C08K 3/22* | (2006.01) |
| *C08K 3/28* | (2006.01) |
| *C08K 3/38* | (2006.01) |

(52) U.S. Cl.
CPC ........ *H01L 23/295* (2013.01); *C08G 59/4042* (2013.01); *C09J 7/28* (2018.01); *C09J 9/00* (2013.01); *C09J 163/00* (2013.01); *C09J 179/08* (2013.01); *H01L 23/293* (2013.01); *H01L 23/3737* (2013.01); *H01L 23/49568* (2013.01); *C08K 2003/2227* (2013.01); *C08K 2003/282* (2013.01); *C08K 2003/385* (2013.01); *C08K 2201/003* (2013.01); *C09J 2201/122* (2013.01); *C09J 2201/602* (2013.01); *C09J 2400/163* (2013.01); *C09J 2479/08* (2013.01); *H01L 2924/0002* (2013.01); *Y10T 428/2804* (2015.01); *Y10T 428/31721* (2015.04)

(58) Field of Classification Search
CPC ......... H01L 2924/0002; H01L 2924/00; H01L 23/293; H01L 23/295; H01L 23/3737; H01L 23/49568; C08G 59/4042; C08K 2003/2227; C08K 2003/282; C08K 2003/385; C08K 2201/003; C09J 163/00; C09J 179/08; C09J 2201/122; C09J 2201/602; C09J 2400/163; C09J 2479/08; C09J 7/28; C09J 9/00; C09J 7/0292; Y10T 428/2804; Y10T 428/31721
See application file for complete search history.

(56) References Cited

U.S. PATENT DOCUMENTS

| | | | |
|---|---|---|---|
| 5,773,877 A * | 6/1998 | Hu | ............. H01L 23/49562 257/666 |
| 2010/0218984 A1 * | 9/2010 | Yamanaka | ............. G03F 7/037 174/258 |
| 2012/0227952 A1 * | 9/2012 | Yoshihara | ............. F28F 3/02 165/185 |
| 2012/0295085 A1 | 11/2012 | Iida et al. | |
| 2013/0245160 A1 | 9/2013 | Shimada et al. | |

FOREIGN PATENT DOCUMENTS

| | | |
|---|---|---|
| JP | 11-222522 A | 8/1999 |
| JP | 2001-63678 A | 3/2011 |
| KR | 10-2009-0063543 A | 6/2009 |
| WO | WO 2011/089922 A1 | 7/2011 |
| WO | WO 2012/073851 A1 | 6/2012 |

OTHER PUBLICATIONS

International Search Report, issued in PCT/JP2014/050684, dated Feb. 25, 2014.

* cited by examiner

*Primary Examiner* — Callie Shosho
*Assistant Examiner* — John D Freeman
(74) *Attorney, Agent, or Firm* — Birch, Stewart, Kolasch & Birch, LLP

(57) ABSTRACT

The purpose of the present invention is to provide an adhesive composition having high heat conductivity and excellent adhesion, in which the dispersibility of a heat-conductive filler is controlled, and in which thermal stress during cooling/heating cycle testing can be alleviated. An adhesive composition containing a soluble polyimide (A), an epoxy resin (B), and a heat-conductive filler (C), the adhesive composition characterized by containing three types of diamine residues having a specific structure, and in that the content of the epoxy resin (B) is 30-100 parts by weight with respect to 100 parts by weight of the soluble polyimide (A).

16 Claims, No Drawings

ADHESIVE COMPOSITION AND ADHESIVE SHEET, AND HARDENED ARTICLE AND SEMICONDUCTOR DEVICE USING SAME

TECHNICAL FIELD

The present invention relates to an adhesive composition to be used in electronic parts and electronic materials. More particularly, it relates to a highly thermally conductive adhesive composition to be used for heat dissipation materials and the like.

BACKGROUND ART

In recent years, energy conservation of power consumption of electronic equipment is required, and therefore the demand for a power semiconductor capable of converting an electric power with high efficiency increases. The power semiconductor is principally used for home electric appliances such as an air conditioner whose power consumption is high and for power control of a hybrid car, an electric vehicle and the like. Particularly, in-vehicle power semiconductors for hybrid cars and electric vehicles requires a large current capacity and requires a cooling system having a high heat-dissipating property. Heat generated in the power semiconductor is transferred to a heatsink through a heat spreader and cooled, and the heat spreader can be bonded to the heatsink using a highly thermally conductive adhesive agent. Since metal such as copper or aluminum is used for the heat spreader and the heatsink, high adhesive strength to these metals is required of the highly thermally conductive adhesive agent, and furthermore in the in-vehicle power semiconductor application, high bonding reliability such that there is no peeling nor crack in a cooling/heating cycle test, is required from usage environment.

As a material used for the highly thermally conductive adhesive agent, there is proposed a resin composition prepared by adding inorganic fillers having high thermal conductivity to a thermosetting resin such as an epoxy resin, to increase the thermal conductivity of the composition (refer to, for example, Patent Document 1). Also, in the adhesive agent containing a polyimide resin or a polyimide silicone resin, there is proposed an adhesive composition in which thermal conductivity, heat resistance, and adhesiveness are improved by adding inorganic fillers having high thermal conductance (refer to, for example, Patent Document 2). Furthermore, there is proposed a highly thermally conductive resin composition in which bonding reliability is improved while alleviating stress in a cooling/heating cycle by adding inorganic fillers having high thermal conductivity to a highly flexible epoxy resin composed of an aliphatic chain (for example, Patent Document 3).

PRIOR ART DOCUMENTS

Patent Documents

Patent Document 1: Japanese Patent Laid-open Publication No. 2008-266378
Patent Document 2: Japanese Patent Laid-open Publication No. 2005-113059
Patent Document 3: Japanese Patent Laid-open Publication No. 2012-126762

SUMMARY OF THE INVENTION

Problems to be Solved by the Invention

However, the conventional highly thermally conductive composition has a problem that when an inorganic filler is contained in the composition in large quantities, since the elastic modulus is increased, peeling or cracks occur during the cooling/heating cycle. Particularly, when copper and aluminum respectively having different coefficients of thermal expansion are bonded to each other with a highly thermally conductive adhesive, since thermal stress exerted on the highly thermally conductive adhesive during the cooling/heating cycle is large, the conventional highly thermally conductive composition could not withstand the stress. A highly thermally conductive adhesive, which has a low elastic modulus and a coefficient of thermal expansion close to those of copper and aluminum in order to mitigate the thermal stress, is required.

Thus, it is an object of the present invention to provide an adhesive composition which is highly thermally conductive and yet low in elastic modulus by controlling the dispersibility of a thermally conductive filler, and which has a coefficient of thermal expansion close to that of copper or aluminum and therefore has excellent bonding reliability in a cooling/heating cycle through alleviating thermal stress.

Solutions to the Problems

In order to solve the above-mentioned problems, the present invention pertains to an adhesive composition containing an organic-solvent-soluble polyimide (A), an epoxy resin (B) and a thermally conductive filler (C), wherein the organic-solvent-soluble polyimide (A) contains a diamine residue having a structure represented by the following general formula (1), a diamine residue represented by the following general formula (2) and a diamine residue represented by the following general formula (3), and the content of the epoxy resin (B) is not less than 30 parts by weight and not more than 100 parts by weight with respect to 100 parts by weight of the organic-solvent-soluble polyimide (A).

[Chemical Formula 1]

(1)

In the general formula (1), X represents an integer of 1 to 10 and n represents an integer of 1 to 20.

[Chemical Formula 2]

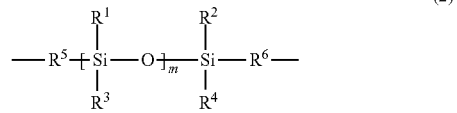

(2)

In the general formula (2), m represents an integer of 1 to 30, and $R^5$ and $R^6$ may be the same or different and represent an alkylene group having 1 to 30 carbon atoms or a phenylene group. $R^1$ to $R^4$ each may be the same or different and represent an alkyl group having 1 to 30 carbon atoms, a phenyl group or a phenoxy group.

[Chemical Formula 3]

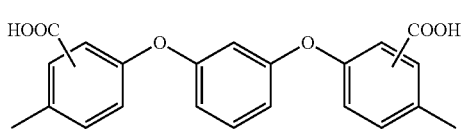

(3)

Effects of the Invention

According to the present invention, it is possible to attain an adhesive composition which is highly thermally conductive and yet low in elastic modulus because of the controlled dispersibility of a thermally conductive filler, and which has a coefficient of thermal expansion close to that of copper or aluminum and therefore has excellent bonding reliability in a cooling/heating cycle through alleviating thermal stress.

EMBODIMENTS OF THE INVENTION

In order to solve the above-mentioned problems, the present invention pertains to an adhesive composition containing an organic-solvent-soluble polyimide (A), an epoxy resin (B) and a thermally conductive filler (C), wherein the organic-solvent-soluble polyimide (A) contains a diamine residue having a structure represented by the following general formula (1), a diamine residue represented by the following general formula (2) and a diamine residue represented by the following general formula (3), and the content of the epoxy resin (B) is not less than 30 parts by weight and not more than 100 parts by weight with respect to 100 parts by weight of the organic-solvent-soluble polyimide (A).

[Chemical Formula 4]

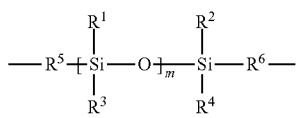

(1)

In the general formula (1), X represents an integer of 1 to 10 and n represents an integer of 1 to 20.

[Chemical Formula 5]

(2)

In the general formula (2), m represents an integer of 1 to 30, and $R^5$ and $R^6$ may be the same or different and represent an alkylene group having 1 to 30 carbon atoms or a phenylene group. $R^1$ to $R^4$ each may be the same or different and represent an alkyl group having 1 to 30 carbon atoms, a phenyl group or a phenoxy group.

[Chemical Formula 6]

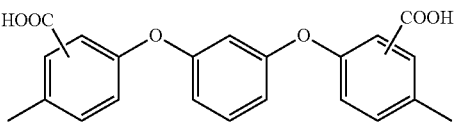

(3)

The organic-solvent-soluble polyimide (A) in the present invention refers to a polyimide, 1 g or more of which is dissolved at 25° C. in 100 g of any organic solvent among amide solvents such as N-methyl-2-pyrrolidone, N,N-dimethylacetamide, N,N-dimethylformamide, N-vinylpyrrolidone and N,N-diethylformamide and ether solvents such as γ-butyrolactone, methylmonoglyme, methyldiglyme, methyltriglyme, ethylmonoglyme, ethyldiglyme, ethylene glycol monomethyl ether, ethylene glycol monoethyl ether, propylene glycol monomethyl ether, propylene glycol monoethyl ether, ethylene glycol dimethyl ether and ethylene glycol diethyl ether.

Moreover, the organic-solvent-soluble polyimide (A) in the present invention is obtained mainly by the reaction of a tetracarboxylic dianhydride with a diamine and has a residue of the tetracarboxylic dianhydride and a residue of the diamine. Herein, the organic-solvent-soluble polyimide (A) in the present invention contains a diamine residue having a structure represented by the above-mentioned general formula (1). Since an alkylene oxide skeleton is highly flexible, the elastic modulus of an adhesive composition obtained by using the polyimide with the structure is reduced and the adhesion of an adhesive composition to a substrate is improved. From the viewpoint of reducing the elastic modulus, the content of the diamine residue having a structure represented by the general formula (1) is preferably 30% by mole or more, more preferably 40% by mole or more in all the diamine residues. Moreover, the content of the diamine residue is preferably 80% by mole or less, more preferably 70% by mole or less in that heat resistance can be enhanced.

In the structure represented by general formula (1), specific examples of $C_xH_{2x}$ include alkylene groups such as a methylene group, an ethylene group, a propylene group, a butylene group, a pentylene group, a hexylene group and a nonylene group. Moreover, the $C_xH_{2x}$ does not need to have a linear structure and in the case where it is a propylene group, for example, it may be either a n-propylene group or an i-propylene group. Moreover, in the case where it is a butylene group, it may be any one of a n-butylene group, an i-butylene group and a t-butylene group. The same holds true for an alkylene group with a greater number of carbon atoms than that.

Examples of the diamine with a structure represented by general formula (1) include polyoxyethylenediamine, polyoxypropylenediamine, polyoxybutylenediamine, bis(4-aminophenoxy)methane, 1,3-bis(4-aminophenoxy)propane, 1,4-bis(4-aminophenoxy)butane, 1,5-bis(4-aminophenoxy)pentane, trimethylene-bis(4-aminobenzoate), tetramethylene-bis(4-aminobenzoate), polytetramethylene oxide-bis(4-aminobenzoate), poly(tetramethylene-3-methyltetramethylene ether)glycol bis(4-aminobenzoate) and the like. Moreover, examples of products corresponding to these diamines include D230, D400, D2000, T403 and T5000 produced by BASF Japan Ltd., Elastomer 250P, Elastomer 650P, Elastomer 1000P, Elastomer 1000, POREA SL-100A and CUA-4 produced by IHARA CHEMICAL INDUSTRY CO., LTD., and the like. In this connection, the diamine with a structure represented by general formula (1) used in the present invention is not limited to the above-mentioned examples.

In the present invention, the organic-solvent-soluble polyimide (A) further contains a diamine residue represented by the following general formula (2). By allowing it to have the diamine residue, the solubility of the organic-solvent-soluble polyimide in an organic solvent is enhanced. Moreover, since the polyimide skeleton is imparted with flexibility by virtue of a siloxane bond, the elastic modulus of an adhesive composition containing the polyimide with such a structure can be reduced. From the viewpoint of reducing the elastic modulus, the content of the diamine residue represented by the following general formula (2) is preferably 10% by mole or more, more preferably 20% by mole or more in all the diamine residues. Moreover, from the viewpoint of allowing the dispersibility affected by hydrophobicity of the siloxane bonded moiety to be enhanced, the content is preferably 50% by mole or less, more preferably 40% by mole or less.

[Chemical Formula 7]

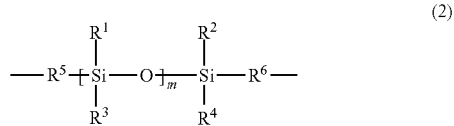

(2)

In the general formula (2), m represents an integer of 1 to 30. $R^5$ and $R^6$ may be the same, or different and represent an alkylene group having 1 to 30 carbon atoms or a phenylene group. $R^1$ to $R^4$ each may be the same or different and represent an alkyl group having 1 to 30 carbon atoms, a phenyl group or a phenoxy group. The alkylene group having 1 to 30 carbon atoms is not particularly limited; however, preferred are a methylene group, an ethylene group, a propylene group and a butylene group. The alkyl group having 1 to 30 carbon atoms is not particularly limited; however, preferred are a methyl group, an ethyl group, a propyl group and a butyl group. In addition, as in the case of the description of $C_xH_{2x}$, the alkylene group and the alkyl group do not need to have a linear structure.

Specific examples of the diamine represented by the general formula (2) include
1,1,3,3-tetramethyl-1,3-bis(4-aminophenyl)disiloxane,
1,1,3,3-tetraphenoxy-1,3-bis(4-aminoethyl)disiloxane,
1,1,3,3,5,5-hexamethyl-1,5-bis(4-aminophenyl)trisiloxane,
1,1,3,3-tetraphenyl-1,3-bis(2-aminoethyl)disiloxane,
1,1,3,3-tetraphenyl-1,3-bis(3-aminopropyl)disiloxane,
1,1,5,5-tetraphenyl-3,3-dimethyl-1,5-bis(3-aminopropyl)trisiloxane,
1,1,5,5-tetraphenyl-3,3-dimethoxy-1,5-bis(4-aminobutyl)trisiloxane,
1,1,5,5-tetraphenyl-3,3-dimethoxy-1,5-bis(5-aminopentyl)trisiloxane,
1,1,3,3-tetramethyl-1,3-bis(2-aminoethyl)disiloxane,
1,1,3,3-tetramethyl-1,3-bis(3-aminopropyl)disiloxane,
1,1,3,3-tetramethyl-1,3-bis(4-aminobutyl)disiloxane,
1,3-dimethyl-1,3-dimethoxy-1,3-bis(4-aminobutyl)disiloxane,
1,1,5,5-tetramethyl-3,3-dimethoxy-1,5-bis(2-aminoethyl)trisiloxane,
1,1,5,5-tetramethyl-3,3-dimethoxy-1,5-bis(4-aminobutyl)trisiloxane,
1,1,5,5-tetramethyl-3,3-dimethoxy-1,5-bis(5-aminopentyl)trisiloxane,
1,1,3,3,5,5-hexamethyl-1,5-bis(3-aminopropyl)trisiloxane,
1,1,3,3,5,5-hexaethyl-1,5-bis(3-aminopropyl)trisiloxane,
1,1,3,3,5,5-hexapropyl-1,5-bis(3-aminopropyl)trisiloxane and the like, but not limited thereto. Examples of products corresponding to these diamines include LP7100, PAM-E, KF8010, X-22-161A, X-22-161B, KF8012 and KF8008 produced by Shin-Etsu Chemical Co., Ltd., and the like.

In the present invention, the organic-solvent-soluble polyimide (A) further contains a residue of diamine represented by the following general formula (3). Since the diamine residue contains many aromatic groups, the heat ray expansion coefficient of the adhesive composition can be lowered by containing the diamine residue. Moreover, since the carboxyl group can react with the epoxy resin (B) to form a cross-linked structure, the heat resistance and the coefficient of thermal expansion of the adhesive composition at elevated temperatures can be lowered. From the viewpoint of reducing the coefficient of thermal expansion of the adhesive composition to improve the heat resistance, the content of the diamine residue represented by the following general formula (3) is preferably 5% by mole or more, more preferably 10% by mole or more in all the diamine residues. Moreover, from the viewpoint of improving the flexibility, the content of the diamine residue is preferably 60% by mole or less, more preferably 50% by mole or less.

[Chemical Formula 8]

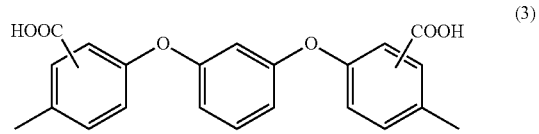

(3)

In the present invention, the weight average molecular weight of the organic-solvent-soluble polyimide (A) is preferably not less than 5,000 and not more than 1,000,000. In the case where two or more organic-solvent-soluble polyimides are contained, the weight average molecular weight of at least one of these needs only to fall within the above-mentioned range. When the weight average molecular weight is 5,000 or more, the mechanical strength is less reduced and the adhesive strength is less reduced. From this point, the weight average molecular weight is preferably 10,000 or more. On the other hand, when the weight average molecular weight is 1,000,000 or less, the viscosity of the resin composition becomes more appropriate and the dispersibility of the thermally conductive filler becomes higher. From this point, the weight average molecular weight is preferably 500,000 or less. In addition, the weight average molecular weight in the present invention is measured by a gel permeation chromatography method (GPC method) and calculated on the polystyrene equivalent basis.

The organic-solvent-soluble polyimide (A) in the present invention may contain, in addition to the above-mentioned diamine residues, another diamine residue to an extent of not impairing the effect of the present invention. Examples of another diamine residue include a residue of a diamine compound exemplified by diamines containing one benzene ring such as 1,4-diaminobenzene, 1,3-diaminobenzene, 2,4-diaminotoluene and 1,4-diamino-2,5-dihalogenobenzene, diamines containing two benzene rings such as bis(4-aminophenyl)ether, bis(3-aminophenyl)ether, bis(4-aminophenyl)sulfone, bis(3-aminophenyl)sulfone, bis(4-aminophenyl)

methane, bis(3-aminophenyl)methane, bis(4-aminophenyl)sulfide, bis(3-aminophenyl)sulfide, 2,2-bis(4-aminophenyl)propane, 2,2-bis(3-aminophenyl)propane, 2,2-bis(4-aminophenyl)hexafluoropropane, o-dianisidine, o-tolidine and tolidine sulfonic acids, diamines containing three benzene rings such as 1,4-bis(4-aminophenoxy)benzene, 1,4-bis(3-aminophenoxy)benzene, 1,4-bis(4-aminophenyl)benzene, 1,4-bis(3-aminophenyl)benzene, α,α'-bis(4-aminophenyl)-1,4-diisopropylbenzene and α,α'-bis(4-aminophenyl)-1,3-diisopropylbenzene, diamines containing four or more benzene rings such as 2,2-bis[4-(4-aminophenoxyl)phenyl]propane, 2,2-bis[4-(4-aminophenoxyl)phenyl]hexafluoropropane, 2,2-bis[4-(4-aminophenoxyl)phenyl]sulfone, 4,4'-(4-aminophenoxyl)biphenyl, 9,9-bis(4-aminophenyl)fluorene and 5,10-bis(4-aminophenyl)anthracene and the like. In addition, examples of another diamine residue are not limited thereto.

No particular restriction is put on an acid dianhydride residue which the organic-solvent-soluble polyimide (A) in the present invention has, and examples of the acid dianhydride residue include a residue of an acid dianhydride such as pyromellitic acid dianhydride (PMDA), oxydiphthalic acid dianhydride (ODPA), 3,3',4,4'-benzophenonetetracarboxylic dianhydride (BTDA), 3,3',4,4'-biphenyltetracarboxylic dianhydride (BPDA), 3,3',4,4'-diphenylsulfonetetracarboxylic dianhydride (DSDA), 2,2'-bis[(dicarboxyphenoxy)phenyl]propane dianhydride (BSAA), 4,4'-hexafluoroisopropylidenediphthalic acid anhydride (6FDA) and 1,2-ethylenebis(anhydrotrimellitate) (TMEG). In addition, examples of the acid dianhydride residue are not limited thereto.

Among the above-mentioned examples, it is preferred that the residue of the tetracarboxylic dianhydride and the residue of the diamine have a structure described in the following 1) to 3). That is, a structure in which 1) there are few benzene rings, 2) the molecular weight is large and the volume is bulky or 3) there are many crooked parts such as an ether linkage. By allowing them to have such a structure, the interaction between molecular chains becomes weak and therefore the solubility of the organic-solvent-soluble polyimide in an organic solvent is, improved.

The organic-solvent-soluble polyimide (A) in the present invention may be composed only of a polyimide structural unit or may be a copolymer having another structure as a copolymerization component in addition to the polyimide structural unit. Moreover, a precursor of the polyimide structural unit (polyamic acid structure) may be contained. Moreover, it may be a mixture thereof. Furthermore, a polyimide represented by another structure may be mixed with any of these. In the case where a polyimide represented by another structure is mixed with that, it is preferred to allow the organic-solvent-soluble polyimide (A) in the present invention to be contained in 50% by mole or more of the content. It is preferred that the kind and amount of the structure employed for copolymerization or mixing be selected without impairing the effect of the present invention.

The method of synthesizing the organic-solvent-soluble polyimide (A) used in the present invention is not particularly limited and the polyimide is synthesized by publicly known methods using a diamine and a tetracarboxylic dianhydride. For example, a method of reacting a tetracarboxylic dianhydride and a diamine compound (a portion thereof may be substituted with an aniline derivative) at a low temperature, a method of preparing a diester by a reaction of a tetracarboxylic dianhydride and an alcohol and then reacting the diester with a diamine (a portion thereof may be substituted with an aniline derivative) in the presence of a condensation agent, a method of preparing a diester by a reaction of a tetracarboxylic dianhydride and an alcohol and then acid chlorinating two carboxyl groups remaining and reacting the resulting diester with a diamine (a portion thereof may be substituted with an aniline derivative) and the like are utilized to prepare a polyimide precursor and a publicly known imidization method may be utilized to synthesize the polyimide from the precursor.

The adhesive composition of the present invention contains an epoxy resin (B). When the adhesive composition contains an epoxy resin, since the viscosity of the adhesive composition is low until the B-stage, the ease of thermocompression bonding between a material prepared by forming the adhesive composition into a sheet (adhesive sheet) and a substrate is enhanced. Moreover, since a crosslinking reaction proceeds three-dimensionally by the hardening reaction of the epoxy resin, the mechanical strength after adhesion, the heat resistance and the adhesion to a substrate are improved.

The epoxy resin (B) used in the present invention preferably contains a structure represented by the following general formula (4). By containing the structure, heat resistance is enhanced and the heat ray expansion coefficient' can be lowered. The content of the epoxy resin containing a structure represented by the following general formula (4) is preferably 5 wt % or more, more preferably 10 wt % or more of the whole amount of the epoxy resin (B) to be mixed from the viewpoint of lowering the coefficient of thermal expansion. Examples of the product corresponding to such an epoxy resin include HP4032, HP4032D and HP4700 produced by DIC Corporation, NC7300 produced by Nippon Kayaku Co., Ltd., and the like.

[Chemical Formula 9]

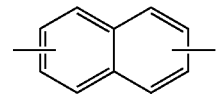

(4)

The epoxy resin (B) used in the present invention is not particularly limited; however, from the viewpoints of enhancing the rheological properties at high temperatures and the mechanical strength after hardening and lowering the coefficient of thermal expansion, a crystalline epoxy resin is preferred. The crystalline epoxy resin refers to an epoxy resin with a mesogenic skeleton such as a biphenyl group, a naphthalene skeleton, an anthracene skeleton, a phenyl benzoate group and a benzanilide group. Examples of the product corresponding to such an epoxy resin include JERYX4000, JERYX4000H, JERYX8800, JERYL6121H, JERYL6640, JERYL6677 and JERYX7399 produced by Mitsubishi Chemical Corporation, NC3000, NC3000H, NC3000L and CER-3000L produced by Nippon Kayaku Co., Ltd., and YSLV-80XY and YDC1312 produced by NIPPON STEEL CHEMICAL CO., LTD.

Moreover, the epoxy resin (B) used in the present invention is preferably an epoxy resin with a fluorene skeleton from the viewpoints of improving the dispersibility of a thermally conductive filler (C) and improving the insulation properties after hardening. Examples of such an epoxy resin include PG100, CG500, CG300-M2, EG200 and EG250 produced by Osaka Gas Chemical Co., Ltd., and the like.

Moreover, the epoxy resin (B) used in the present invention is preferably an epoxy resin which is liquid at a room temperature from the viewpoints of flexibility at the B-stage and adhesion strength to a substrate. The epoxy resin which is liquid at a room temperature refers to an epoxy resin exhibiting a viscosity of 150 Pa·s or less at 25° C. under $1.013 \times 10^5$ N/m$^2$, which can be selected from among a bisphenol A based epoxy resin, a bisphenol F based epoxy resin, an alkylene oxide-modified epoxy resin, a glycidyl amine based epoxy resin and the like, for example. Examples of the product corresponding to such an epoxy resin include JER827, JER828, JER806, JER807, JER801N, JER802, JER604, JER630 and JER630LSD produced by. Mitsubishi Chemical Corporation, EPICLON840S, EPICLON850S, EPICLON830S, EPICLON705 and EPICLON707 produced by DIC Corporation, YD127, YD128, PG207N and PG202 produced by NIPPON STEEL CHEMICAL Co., Ltd., and the like.

Moreover, the epoxy resin (B) used in the present invention may be composed of one kind thereof and may be used in combination of two or more kinds thereof. The content of the epoxy resin (B) is not less than 30 parts by weight and not more than 100 parts by weight with respect to 100 parts by weight of the organic-solvent-soluble polyimide (A). From the viewpoint of ease of thermocompression bonding of an adhesive sheet at the B-stage to a substrate, the content has to be 30 parts by weight or more and is preferably 40 parts by weight or more. Moreover, from the viewpoints of lowering the cross-linking density of the epoxy resin after hardening and reducing the elastic modulus of the adhesive composition, the content of the epoxy resin (B) has to be 100 parts by weight or less and is preferably 90 parts by weight or less with respect to 100 parts by weight of the organic-solvent-soluble polyimide (A).

Furthermore, a hardening agent may be contained in the adhesive composition of the present invention as required. By combining an epoxy resin and a hardening agent, it is possible to accelerate the hardening of the epoxy resin and to harden the epoxy resin in a short time. As the hardening agent, imidazoles, polyhydric phenols, acid anhydrides, amines, hydrazides, polymercaptans, Lewis acid-amine complexes, latent hardening agents and the like may be used. Among these, imidazoles, polyhydric phenols and latent hardening agents which are excellent in storage stability and heat resistance of the hardened article are preferably used. These may be used alone or two or more kinds thereof may be mixed to use.

Examples of the imidazoles include Curezol 2MZ, Curezol 2PZ, Curezol 2MZ-A and Curezol 2MZ-OK (the above are trade names, produced by SHIKOKU CHEMICALS CORPORATION). Examples of the polyhydric phenols include SUMILITE RESIN PR-HF3 and SUMILITE RESIN PR-HF6 (the above are trade names, produced by SUMITOMO BAKELITE CO., LTD.), KAYAHARD KTG-105 and KAYAHARD NHN (the above are trade names, produced by Nippon Kayaku Co., Ltd.), PHENOLITE TD2131, PHENOLITE TD2090, PHENOLITE VH-4150, PHENOLITE KH-6021, PHENOLITE KA-1160 and PHENOLITE KA-1165 (the above are trade names, produced by DIC Corporation) and the like. Moreover, examples of the latent hardening agents include a dicyandiamide based latent hardening agent, an amine adduct based latent hardening agent, an organic acid hydrazide based latent hardening agent, an aromatic sulfonium salt based latent hardening agent, a microcapsulated latent hardening agent and a, photo-curable latent hardening agent.

Examples of the dicyandiamide based latent hardening agent include DICY7, DICY15 and DICY50 (the above are trade names, produced by JAPAN EPDXY RESINS CO., LTD.), AJICURE AH-154 and AJICURE AH-162 (the above are trade names, produced by Ajinomoto Fine-Techno Co., Inc.)' and the like. Examples of the amine adduct based latent hardening agent include AJICURE PN-23, AJICURE PN-40, AJICURE MY-24 and AJICURE MY-H (the above are trade names, produced by Ajinomoto Fine-Techno Co., Inc.) Fujicure FXR-1030 (trade name, produced by FUJI KASEI CO., LTD.) and the like. Examples of the organic acid hydrazide based latent hardening agent include AJICURE VDH and AJICURE UDH (the above are trade names, produced by Ajinomoto Fine-Techno Co., Inc.) and the like. Examples of the aromatic sulfonium salt based latent hardening agent include San-Aid SI100, San-Aid SI150 and San-Aid SI180 (the above are trade names, produced by SANSHIN CHEMICAL INDUSTRY CO., LTD.) and the like. Examples of the microcapsulated latent hardening agent include materials prepared by capsulating each of the above-mentioned hardening agents with a vinyl compound, a urea compound or a thermoplastic resin. Of these, examples of the microcapsulated latent hardening agent prepared by treating the amine adduct based latent hardening agent with an isocyanate include NOVACURE HX-3941HP, NOVACURE HXA3922HP, NOVACURE HXA3932HP and NOVACURE HXA3042HP (the above are trade names, produced by ASAHI KASEI CHEMICALS CORPORATION) and the like. Moreover, examples of the photo-curable latent hardening agent include OPTOMER SP and OPTOMER CP (produced by ADEKA CORPORATION) and the like.

When the hardening agent is contained in the adhesive composition, the content thereof is preferably not less than 0.1 part by weight and not more than 35 parts by weight with respect to 100 parts by weight of the epoxy resin (B).

The adhesive composition of the present invention contains a thermally conductive filler (C). In the present invention, the thermally conductive filler refers to a filler having a thermal conductivity of 2 W/m·K or more at 25° C. After a sintered body with a thickness of about 1 mm and a porosity of 10% or less is prepared, the thermal conductivity of the filler may be measured and determined according to JIS R1611 (2010). In addition, it is described in "7.2 Measurement Method" of JIS R 1611 (2010) that Measurement of c) a bulk density and thermal diffusivity is performed according to JIS R 1634, and in the measurement in the present invention, a measurement of "c) a bulk density" refers to a value determined according to JIS R 1634 (1998). The thermally conductive filler (C) is not particularly limited as long as it is a filler like this and examples thereof include carbon black, silica, magnesium oxide, zinc oxide, alumina, aluminum nitride, boron nitride, silicon carbide, silicon nitride, copper, aluminum, magnesium, silver, zinc, iron, lead, and the like. These fillers may be used alone or in combination of plural fillers. Moreover, the shape of the filler is not particularly limited, and examples thereof include a perfectly spherical shape, a spherical shape, a scalelike shape, a flaky shape, a foillike shape, a fibrous shape, a needlelike shape and the like. From the viewpoint of allowing the thermally conductive filler to be densely contained, preferred is a filler having a perfectly spherical shape.

In the present invention, the content of the thermally conductive filler (C) is preferably not less than 60% by volume and not more than 90% by volume in the adhesive composition. Since the content is not less than 60% by volume and not more than 90% by volume, the thermal conductivity of the adhesive composition becomes higher. The content is more preferably not less than 65% by volume and not more than 85% by volume. In addition, when the adhesive composition is used as a sheet as described below, the content of the thermally conductive filler (C) in the sheet is preferably not less than 60% by volume and not more than 90% by volume, more preferably not less than 65% by volume and not more than 85% by volume.

The content by volume of the filler is determined by calculating the content by volume of each ingredient from the content by weight and specific gravity of each ingredient contained in the adhesive composition. Herein, with regard to calculating the percentage content by volume (vol. %) of the filler in, the adhesive composition and the sheet, in the case where the adhesive composition and the sheet contain a solvent, the solvent shall not be included in the calculation. That is, the total of the content by volume of the ingredients excluding the solvent among ingredients contained in the adhesive composition or the sheet is employed as the denominator and the percentage content by volume of the filler is calculated.

Examples of the method of calculating the percentage content by volume of the filler from the hardened article of the sheet include, but not limited to, a method of utilizing the following thermogravimetric analysis. First, the hardened article of the sheet is heated to 600 to 900° C. to decompose and volatilize a resin content, a weight of the filler contained is measured, and further a weight of the resin is calculated. Thereafter, the weights of the filler and the resin are divided by the specific gravities of the filler and the resin, respectively, to calculate the volumes of the filler and the resin, and thereby the percentage content by volume is determined.

It is preferred that the thermally conductive filler (C) contains three types of thermally conductive fillers differing in the average particle diameter, a thermally conductive filler (C-1), a thermally conductive filler, (C-2) and a thermally conductive filler (C-3), and when average particle diameters of the thermally conductive fillers (C-1), (C-2) and (C-3) are denoted by d1, d2 and d3, respectively, an average particle diameter ratio d1/d2 is not less than 1.5 and not more than 15 and an average particle diameter ratio d2/d3 is not less than 1.5 and not more than 15. It is more preferred that the average particle diameter ratio d1/d2 is not less than 2.0 and not more than 10 and the average particle, diameter ratio d2/d3 is not less than 2.0 and not more than 10. When the average particle diameter ratio d1/d2 is not less than 1.5 and not more than 15 and the average particle diameter ratio d2/d3 is not less than 1.5 and not more than 15, it becomes possible to make the thermally conductive fillers more densely contained in the adhesive composition and therefore a higher thermal conductivity and higher insulation properties are achieved.

The thermally conductive filler (C-1) has the average particle diameter of preferably 20 μm or more, more preferably 30 μm or more. By having the average particle diameter of 20 or more, an adhesive composition having a higher thermal conductivity is attained. The thermally conductive filler (C-1) has the average particle diameter of preferably 200 μm or less, more preferably 100 μm or less. By having the average particle diameter of 200 μm or less, the surface roughness of the adhesive composition at the B-stage can be decreased and the adhesive strength can be more enhanced.

By containing the thermally conductive filler (C-3) having the average particle diameter of 2 μm or less, it becomes possible to fill the thermally conductive filler (C-3) into a gap between the thermally conductive filler (C-1) and the thermally conductive filler (C-2) to increase a packing density, and therefore an adhesive composition having higher insulation properties and a low coefficient of thermal expansion is attained. A lower limit of the average particle diameter is not particularly limited, and it is preferably 0.01 μm or more, more preferably 0.1 μm or more.

Moreover, the content of the thermally conductive filler (C-1) is preferably 40% by volume or more in the whole thermally conductive fillers (C), more preferably 50% by volume or more from the viewpoint of achieving an adhesive composition having a higher thermal conductivity. Moreover, from the viewpoint of increasing the packing density of the thermally conductive filler to obtain an adhesive composition having higher thermal conductance and insulation properties, the content of the thermally conductive filler (C-1) is preferably 80% by volume or less in the whole thermally conductive fillers (C), more preferably 70% by volume or less.

The thermally conductive filler (C-1) is preferably aluminum nitride. When aluminum nitride is used as an insulating thermally conductive filler, the thermal conductivity is as high as about 170 W/m·K, and therefore an adhesive resin composition having a higher thermal conductivity is obtained. Examples of such an aluminum nitride particle include FAN-f30, FAN-f50 and FAN-f80 produced by Furukawa Denshi Co., Ltd., and M30, M50 and M80 produced by MARUWA CO., LTD.

As the thermally conductive filler (C-2), preferred are alumina, boron nitride, aluminum nitride, zinc oxide, magnesium oxide, silica and the like. The reason for this is that these fillers have high thermal conductivity and are highly effective in increasing the thermal conductivity of the adhesive resin composition.

Moreover, the thermally conductive filler (C-3) is preferably boron nitride. In the case of boron nitride fillers, since polar functional groups such as an amino group or a hydroxyl group are present at the surface of the filler, the filler has good dispersibility into the organic-solvent-soluble polyimide by an interaction with an amino group or a hydroxyl group of the organic-solvent-soluble polyimide (A), and therefore the packing density of the fillers can be more increased and the insulation properties of the adhesive resin composition can be improved. Moreover, when boron nitride is used as an insulating thermally conductive filler, the thermal conductivity is as high as about 40 W/m·K, and therefore an adhesive resin composition can also have a higher thermal conductivity. Examples of such a boron nitride particle include MBN-010T produced by Mitsui Chemicals Co., Ltd.

In the present invention, the average particle diameter refers to an average particle diameter of primary particles when the particles are not flocculated and in the case where the particles are flocculated, it refers to an average particle diameter of the aggregates. The adhesive composition of the present invention may contain a surfactant as required, and thereby, it is possible to improve wettability to a substrate. Moreover, a silane coupling agent such as methylmethacryloxy dimethoxysilane and 3-aminopropyl trimethoxysilane, a titanate chelating agent and the like may be contained in the adhesive composition in an amount of 0.5 to 10% by weight.

Next, a method of forming the adhesive composition of the present invention into a sheet to prepare an adhesive sheet will be described. In order to form the adhesive composition of the present invention into a sheet, for example, a material in the condition of being a varnish prepared by mixing the adhesive composition in a solvent may be applied onto a support, dried and formed into a sheet.

The solvent used herein needs only to be appropriately selected from solvents capable of dissolving the above-mentioned ingredients, and examples thereof include ketone solvents such as acetone, methyl ethyl ketone, methyl isobutyl ketone, cyclopentanone and cyclohexanone; ether solvents such as 1,4-dioxane, tetrahydrofuran and diglyme; glycol ether solvents such as methyl cellosolve, ethyl cellosolve, propylene glycol monomethyl ether, propylene glycol monoethyl ether, propylene glycol monobutyl ether and diethylene glycol methyl ethyl ether; and other solvents such as benzyl alcohol, propanol, N-methylpyrrolidone, γ-butyrolactone, ethyl acetate, N,N-dimethylformamide and the like. Above all, when a solvent having a boiling point of 120° C. or lower under atmospheric pressure is used, since the solvent can be removed at a low temperature in a short time, sheet forming is facilitated.

The method of forming the adhesive composition of the present invention into a material in the condition of being a varnish is not particularly limited; however, preferred is a method of mixing the organic-solvent-soluble polyimide (A), the epoxy resin (B), the thermally conductive filler (C) and other ingredients contained as required in the above-mentioned solvent using a propeller agitator, a homogenizer, a kneader or the like and then mixing them by use of a bead mill, a ball mill, a three roll mill or the like from the viewpoint of improving the dispersibility of the thermally conductive filler (C).

Examples of the method of applying a varnish onto a support include spin coating with a spinner, spray coating, roll coating, screen printing and a coating method using a blade coater, a die coater, a calender coater, a meniscus coater, a bar coater, a roll coater, a comma roll coater, a gravure coater, a screen coater, a slit die coater or the like.

A roll coater, a comma roll coater, a gravure coater, a screen coater, a slit die coater or the like may be used as a coating machine, and a slit die coater is preferably used since there is little volatilization of the solvent on coating and stable coating properties are attained. The thickness of an adhesive composition formed into a sheet (an adhesive sheet) is not particularly limited; however, from the viewpoints of insulation properties such as the withstand voltage and heat dissipation properties, it is preferably in the range of 20 to 300 μm.

For drying, an oven, a hot plate, infrared rays or the like may be used. The drying temperature and the drying time need only to be in a range where the organic solvent can be volatilized and it is preferred that such a range in which the adhesive sheet is in a state of being unhardened or semi-hardened (a state of being at the B-stage) be appropriately set. Specifically, it is preferred that the adhesive sheet be maintained in the range of 40° C. to 120° C. for 1-minute to several tens of minutes. Moreover, several temperatures may be used in combination and the drying temperature may be increased stepwise, and for example, a heat treatment may be carried out at 70° C., 80° C. and 90° C. for 1 minute each.

The support is not particularly limited, and usually commercially available various films such as a polyethylene terephthalate (PET) film, a polyphenylene sulfide film and a polyimide film are usable.

The combined surface of the support to the adhesive composition may be subjected to a surface treatment with silicone, a silane coupling agent, an aluminum chelating agent, polyurea and the like in order to improve the adhesion and the release properties. Moreover, the thickness of the support is not particularly limited; however, from the viewpoint of usability, it is preferably in the range of 10 to 100 μm.

Moreover, the adhesive sheet may have a protective film in order to protect the surface thereof. This enables the adhesive sheet surface to be protected from contaminants such as garbage and dust in the air.

Examples of the protective film include a polyethylene film, a polypropylene (PP) film, a polyester film and the like. It is preferred that the protective film have a small adhesive force to the adhesive sheet.

Next, a method of bonding substrates and members utilizing the adhesive composition or adhesive sheet of the present invention will be described with reference to examples. The adhesive composition is preferably formed into a material in the condition of being a varnish as described above to be used. First, using an adhesive composition, varnish, an adhesive composition coating is formed on one surface of a substrate or a member to be bonded. Examples of the substrate and the member include a thin plate made of, metallic materials such as copper and SUS, a semiconductor device (a lead frame part thereof and the like) to be bonded thereto, and the like. Examples of a coating method of the adhesive composition, varnish include spin coating using a spinner, spray coating, roll coating, screen printing or the like. Moreover, the coating thickness varies with the coating technique, the solid content of the resin composition, the viscosity and the like; however it is preferred to apply the varnish so that the dried thickness is usually not less than 50 μm and not more than 400 μm. Then, the substrate provided with the adhesive composition, varnish applied is dried to obtain an adhesive composition coating. On drying, an oven, a hot plate, an infrared lamp or the like may be used. The drying temperature and the drying time need only to be in a range where the organic solvent can be volatilized and it is preferred that such a range in which the adhesive resin composition coating is in a state of being unhardened or semi-hardened be appropriately set. Specifically, drying is preferably carried out in the range of 50 to 150° C. for 1 minute to several hours.

On the other hand, when the adhesive sheet has a protective film, the film is peeled off, and the adhesive sheet and a substrate are opposed to each other and bonded together by thermocompression bonding. The thermocompression bonding may be carried out by a hot pressing treatment, a heat laminating treatment, a heat vacuum laminating treatment or the like. The bonding temperature is preferably 40° C. or higher from the viewpoints of adhesion to a substrate and embeddability. Moreover, when the temperature becomes higher in bonding, since the time required for hardening the adhesive sheet becomes short and the usability is decreased, the bonding temperature is preferably 250° C. or lower. When the adhesive sheet has a support, the support may be peeled off before bonding and may be peeled off at any point of time during the thermocompression bonding process or after thermocompression bonding.

The substrate on which the adhesive composition coating thus obtained is formed is bonded to another substrate or other members by thermocompression. The thermocompression bonding temperature is preferably in the temperature range of 100 to 400° C. Moreover, the pressure in press-bonding is preferably in the range of 0.01 to 10 MPa. The time is preferably 1 second to several minutes.

After thermocompression bonding, the coating is hardened by heating at a temperature of 120° C. to 400° C. range is applied to obtain a hardened film. This heat treatment is carried out by setting temperatures and increasing the temperature stepwise or setting a temperature range and continuously increasing the temperature for 5 minutes to 5 hours. In one case, the heat treatment is carried out at 130° C. and 200° C. for 30 minutes each. Moreover, examples thereof include a method of linearly increasing the temperature over a 2-hour period from a room temperature to 250° C. In this case, the heating temperature is preferably a temperature of 150° C. or higher and 300° C. or lower, and further preferably a temperature of 180° C. or higher and 250° C. or lower.

With regard to a bonded body thus obtained by thermocompression bonding, the peel strength is preferably 2 N/cm or more, more preferably 3 N/cm or more from the viewpoint of adhesion reliability.

When a copper plate and an aluminum plate are laminated by thermocompression bonding using an adhesive agent and the resulting laminate is subjected to a cooling/heating cycle test, it is preferred that the elastic modulus of a hardened film of the adhesive agent is low and the coefficient of thermal expansion of the hardened film is close to that of copper or aluminum from the viewpoint of reducing thermal stress at a bonding interface.

From the viewpoint of reducing thermal stress at low temperatures, the elastic modulus of the hardened film obtained by thermocompression bonding is preferably 33 GPa or less at −45° C., more preferably 30 GPa or less at −45° C. From the same viewpoint, the elastic modulus is preferably 14 GPa or less at 25° C., more preferably 12 GPa or less at 25° C.

From the viewpoint of reducing thermal stress, the coefficient of thermal expansion of the hardened film obtained by thermocompression bonding is preferably not less than 15 ppm and not more than 25 ppm at temperatures of −45° C. to 125° C., more preferably not less than 17 ppm and not more than 23 ppm at temperatures of −45° C. to 125° C.

The thickness of the hardened film may be optionally set; however, it is preferably not less than 50 μm and not more than 300 μm.

Next, the application of the adhesive composition in the present invention will be described with reference to an example, but the application of the adhesive composition of the present invention is not limited to the following.

The adhesive composition in the present invention can be widely used as an adhesive for a semiconductor device and is suitably used especially for power IC packaging. Power IC refers to an IC for power control and it is an IC in which the SiC semiconductor as well as the conventional Si semiconductor is used, and it is an IC which is driven at higher temperatures and has a great calorific value compared to an IC for computing. An adhesive layer is formed by sticking an adhesive sheet to a radiating fin made of a metallic substrate or by applying a varnish of an adhesive composition onto the radiating fin and drying it. Thereafter, the radiating fin is, by thermocompression, bonded to a lead frame, which is made of copper, of a semiconductor device having the power IC mounted to obtain the power IC packaging. In addition, the semiconductor device in the present invention refers to devices in general which can function by utilizing characteristics of a semiconductor element as well as a device in which a semiconductor element is connected to a substrate or a device in which semiconductor elements or substrates are connected each other, and an electrooptic device, a semiconductor circuit board and electronic parts including them are all included in the semiconductor device.

EXAMPLES

Hereinafter, the present invention will be described in detail based on Examples, but the present invention is not limited thereto. In addition, the details of raw materials denoted by the abbreviation in each Example will be shown below.

<Raw Materials for Polyimide>

ODPA: 4,4'-oxydiphthalic acid dianhydride (produced by Manac, Inc.)

NJM-06: 1,3'-bis(4-amino-2-carboxyphenoxy)benzene (produced by Nippon Junryo Chemicals Co., Ltd.)

LP7100: bis(3-aminopropyl)tetramethyldisiloxane (produced by Shin-Etsu Chemical Co., Ltd.)

KF8010: diaminopolysiloxane (produced by Shin-Etsu Chemical Co., Ltd.)

Elastomer 1000: polytetramethylene oxide-di-para-aminobenzoate (produced by IHARA CHEMICAL INDUSTRY CO., LTD.)

BAPP: 2,2'-bis{4-(4-aminophenoxyl)phenyl}propane (produced by Wakayama Seika Kogyo Co., Ltd.)

<Epoxy Resin>

JER828: bisphenol A based liquid epoxy resin (produced by Mitsubishi Chemical Corporation)

HP4032: an epoxy resin having a naphthalene skeleton (produced by DIC Corporation)

<Thermally Conductive Filler>

DAW-45: alumina particles (average particle diameter: 45 μm, thermal conductivity: 26 W/m·K) (produced by DENKI KAGAKU KOGYO K.K.)

AO509: alumina particles (average particle diameter: 9 μm, thermal conductivity: 20 W/m·K) (produced by Admatechs Co., Ltd.: brand name Admatechs)

AO502: alumina particles (average particle diameter: 0.7 μm, thermal conductivity: 20 W/m·K) (produced by Admatechs Co., Ltd.: brand name Admatechs)

FAN-30: aluminum nitride particles (average particle diameter: 30 μm, thermal conductivity: 170 W/m·K) (produced by Furukawa Denshi Co., Ltd.)

FAN-50: aluminum nitride particles (average particle diameter: 50 μm, thermal conductivity: 170 W/m·K) (produced by Furukawa Denshi Co., Ltd.)

FAN-80: aluminum nitride particles (average particle diameter: 80 μm, thermal conductivity: 170 W/m·K) (produced by Furukawa Denshi Co., Ltd.)

MBN-010T: boron nitride (average particle diameter: 0.9 μm, thermal conductivity: 40 W/m·K) (produced by Mitsui Chemicals Co., Ltd.)

<Hardening Agent>

2P4MZ: 2-phenyl-4-methylimidazole

<Solvent>

Triglyme: triethylene glycol dimethyl ether

The evaluation method in each of Examples and Comparative Examples will be shown below.

<Weight Average Molecular Weight of Polyimide Synthesized>

By using a solution having a solid content of 0.1% by weight prepared by dissolving polyimide in N-methyl-2-pyrrolidone (hereinafter, abbreviated to NMP) and the GPC apparatus Waters2690 (manufactured by Waters Corp.) having the following configuration, a weight average molecular weight on the polystyrene equivalent basis was calculated. With regard to the conditions for GPC measurement, NMP in which LiCl and phosphoric acid each were dissolved at a concentration of 0.05 mol/l was employed as the mobile phase and the running rate was set to 0.4 ml/minute.

Detector: Waters996
System controller: Waters2690
Column oven: Waters HTR-B
Thermo controller: Waters TCM
Column: TOSOH grard comn Column: THSOH TSK-GEL α-4000
Column: TOSOH TSK-GEL α-2500

<Imidization Ratio of Polyimide Synthesized>

First, the infrared absorption spectrum of a polymer was measured and the presence of absorption peaks (at about 1780 cm$^{-1}$ and about 1377 cm$^{-1}$) of the imide structure derived from polyimide was confirmed. Next, the polymer was subjected to a heat treatment at 350° C. for 1 hour and then the infrared absorption spectrum was measured again, and the peak intensities at about 1377 cm$^{-1}$ before and after the heat treatment were compared. By assuming that the imidization ratio of the polymer after the heat treatment was 100%, an imidization ratio of the polymer before the heat treatment was determined.

<Preparation of Adhesive Sheet>

An adhesive composition prepared in each of Examples and Comparative Examples was applied onto a PET film having a thickness of 38 μm as a support using a comma roll coater and dried at 100° C. for 30 minutes, and then as a protective film, a PP film having a thickness of 10 μm was laminated to obtain an adhesive sheet. Coating was carried out so that an adhesive layer in the adhesive sheet had a thickness of 220 μm.

<Sticking Property to Copper Foil>

The protective film of the adhesive sheet prepared in the above-mentioned manner was peeled off and the peeled surface was pressed on a copper foil (NA-VLP with a thickness of 15 μm: manufactured by MITSUI MINING & SMELTING CO., LTD) using a hot-pressing machine under the conditions of a pressing temperature of 100° C., an applied pressure of 1 MPa and a pressing time of 5 minutes. Then, one in which an adhesive sheet does not remain on the support film and is stuck on the copper foil when the support film is peeled off is defined as being good (○) and another one in which an adhesive sheet fails to be stuck and remains on the support film is defined as being poor (x)

<Adhesive Strength>

The protective film of the adhesive sheet prepared in the above-mentioned manner was peeled off and the peeled surface was pressed on a copper foil using a hot-pressing machine under the conditions of a pressing temperature of 100° C., an applied pressure of 1 MPa and a pressing time of 5 minutes. After the support film was peeled off, another copper foil was laminated on the adhesive composition and pressed under the conditions of a pressing temperature of 180° C., an applied pressure of 2 MPa and a pressing time of 10 minutes. Thereafter, the adhesive composition was thermally hardened over a 1-hour period in a hot air circulating dryer at 180° C. Copper foil on one side of the laminate thus obtained only was etched and removed with a ferric chloride aqueous solution and was subjected to fabrication for a circuit having a line width of 2 mm. Thereafter, a strip of copper foil having a width of 2 mm was pulled upward in a direction at 90° C. relative to the laminate with a push pull gauge to measure the adhesive strength.

<Thermal Conductivity>

The protective film of the adhesive sheet prepared in the above-mentioned manner was peeled off and the peeled surface was pressed on a copper foil using a hot-pressing machine under the conditions of a pressing temperature of 100° C., an applied pressure of 1 MPa and a pressing time of 5 minutes. After the support film was peeled off, another copper foil was laminated on the adhesive composition and pressed under the conditions of a pressing temperature of 180° C., an applied pressure of 2 MPa and a pressing time of 10 minutes. Thereafter, the adhesive composition was thermally hardened over a 1-hour period in a hot air circulating dryer at 180° C. The whole copper foil on the laminate thus obtained was etched and removed with a ferric chloride aqueous solution to obtain a hardened article of the adhesive composition having a thickness of 200 μm. Thereafter, the thermal diffusivity of the hardened article was measured using the laser flash thermal diffusivity measuring apparatus LFA447 manufactured by NETZSCH Japan. Moreover, the specific gravity of the hardened article was measured by an Archimedes method and the specific heat of the hardened article was measured by a DSC method to calculate the thermal conductivity according to the equation such that thermal diffusivity×specific gravity×specific heat. The percentage content by volume of the filler was determined by dividing the weight of each of the ingredients of the resin composition added by the specific gravity to calculate the volume.

<Withstand Voltage>

A hardened article of the adhesive composition having a thickness of 200 μm was obtained in the same manner as in the above-mentioned description. With regard to the hardened article, the withstand voltage at a temperature of 23° C. and a relative humidity of 50% RH was measured using the withstand voltage testing device TOS5101 manufactured by KIKUSUI ELECTRONICS CORP. The measurement was carried out at a voltage raising rate of 5.0 kV/second by an alternating current and a voltage measured at the time when an electric current of 0.2 mA or more flowed was defined as the withstand voltage.

<Elastic Modulus>

A hardened article of the adhesive composition having a thickness of 200 μm was obtained in the same manner as in the above-mentioned description. The hardened article was cut into a piece with a size of 5 mm×30 mm, and the elastic modulus of the piece was measured in a temperature range of −45° C. to 125° C. by using a dynamic viscoelastic analyzer DVA-220 (manufactured by ITK Co., Ltd.). The measurement was carried out under the conditions of a distance between chucks of 20 mm, a temperature raising rate of 5° C./min, a frequency of 1 Hz and a distortion of 0.1%.

<Coefficient of Thermal Expansion>

A hardened article of the adhesive composition having a thickness of 200 μm was obtained in the same manner as in the above-mentioned description. The hardened article was cut into a piece with a size of 3 mm×30 mm, and the coefficient of thermal expansion of the piece was measured in a temperature range of −45° C. to 125° C. by using a thermomechanical analyzer TMASS/6100S. The measurement was carried out under the conditions of a distance between chucks of 20 mm, a temperature raising rate of 5° C./rain and a tensile load of 200 mN.

<Cooling/Heating Cycle Test (Thermal Cycle Test (TCT))>

The protective film of the adhesive sheet prepared in the above-mentioned manner was peeled off and the peeled surface was placed on an aluminum plate of 80 mm×80 mm×6 mm (thick) and pressed by hot-pressing under the conditions of a pressing temperature of 100° C., an applied pressure of 1 MPa and a pressing time of 5 minutes. After the support film was peeled off, a copper plate of 60 mm×60 mm×7.5 mm (thick) was placed on the adhesive composition and pressed under the conditions of a pressing temperature of 180° C., an applied pressure of 2 MPa and a pressing time of 10 minutes. Thereafter, the adhesive composition was thermally hardened over a 1-hour period in a hot air circulating dryer at 180° C. The laminate thus obtained was subjected to a cooling/heating cycle test of 1000 cycles, one cycle of which consists of storage at −45° C. for 15 minutes and storage at 125° C. for 15 minutes by using a thermal cycle testing machine (manufactured by Tabai Espec Corp.). The laminate having no peeling at a bonding interface was rated as "○", and a sample having peeling or a crack at a bonding interface was rated as "x". The presence or absence of peeling at the bonding interface was observed by an ultrasonic imaging apparatus FineSAT/FS300III (manufactured by Hitachi Engineering & Services Co., Ltd.).

Example 1

Into a 300 ml four necked flask equipped with a stirrer, a thermometer, a nitrogen inlet tube and a dropping funnel, under a nitrogen atmosphere, were charged 113.33 g of triglyme and 11.79 g of ODPA, and the resulting mixture was stirred at 60° C. and dissolved. Thereafter, to this, 22.28 g of Elastomer 1000, 12.04 g of KF8010, 1.64 g of BAPP and 1.52 g of NJM-06 were added while stirring at 60° C., and the resulting mixture was stirred for 1 hour. Then, the mixture was heated to 180° C. and stirred for 3 hours, and cooled to a room temperature to obtain a polyimide solution A (solid content of 30.0% by weight). The weight average molecular weight of the polyimide was determined to be 48,200 and the imidization ratio was determined to be 99%. To 48.63 g of the polyimide solution A obtained in the above-mentioned manner, 4.16 g of HP4032, 6.25 g of JER828 and 0.8 g of 2P4MZ were added, and the resulting mixture was mixed/stirred. To this, 132 g of FAN-50, 100 g of AO509 and 25 g of MBN-010T were added, and the resulting mixture was kneaded five times with a three roll mill to form an adhesive composition which was a viscous liquid. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 2

Into a 300 ml four necked flask equipped with a stirrer, a thermometer, a nitrogen inlet tube and a dropping funnel, under a nitrogen atmosphere, were charged 111.84 g of triglyme and 11.79 g of ODPA, and the resulting mixture was stirred at 60° C. and dissolved. Thereafter, to this, 22.28 g of Elastomer 1000, 12.04 g of KF8010, 0.99 g of LP7100 and 1.52 g of NJM-06 were added while stirring at 60° C., and the resulting mixture was stirred for 1 hour. Then, the mixture was heated to 180° C. and stirred for 2 hours, and cooled to a room temperature to obtain a polyimide solution B (solid content of 30.0% by weight). The weight average molecular weight of the polyimide was determined to be 44,000 and the imidization ratio was determined to be 99%. To 48.63 g of the polyimide solution B thus obtained, ingredients shown in Table 1 were added, and the resulting mixture was mixed in the same manner as in Example 1 to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 3

Into a 300 ml four necked flask equipped with a stirrer, a thermometer, a nitrogen inlet tube and a dropping funnel, under a nitrogen atmosphere, were charged 103.98 g of triglyme and 11.79 g of ODPA, and the resulting mixture was stirred at 60° C. and dissolved. Thereafter, to this, 14.86 g of Elastomer 1000, 13.76 g of KF8010, 3.28 g of BAPP and 1.52 g of NJM-06 were added while stirring at 60° C., and the resulting mixture was stirred for 1 hour. Then, the mixture was heated to 180° C. and stirred for 2 hours, and cooled to a room temperature to obtain a polyimide solution C (solid content of 30.0% by weight). The weight average molecular weight of the polyimide was determined to be 41,000 and the imidization ratio was determined to be 99%. To 48.63 g of the polyimide solution C thus obtained, ingredients shown in Table 1 were added, and the resulting mixture was mixed in the same manner as in Example 1 to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 4

Into a 300 ml four necked flask equipped with a stirrer, a thermometer, a nitrogen inlet tube and a dropping funnel, under a nitrogen atmosphere, were charged 114.87 g of triglyme and 14.74 g of ODPA, and the resulting mixture was stirred at 60° C. and dissolved. Thereafter, to this, 12.38 g of Elastomer 1000, 17.20 g of KF8010, 3.73 g of LP7100 and 1.90 g of NJM-06 were added while stirring at 60° C., and the resulting mixture was stirred for 1 hour. Then, the mixture was heated to 180° C. and stirred for 2 hours, and cooled to a room temperature to obtain a polyimide solution C (solid content of 30.0% by weight). The weight average molecular weight of the polyimide was determined to be 39,600 and the imidization ratio was determined to be 99%. To 48.63 g of the polyimide solution C thus obtained, ingredients shown in Table 1 were added, and the resulting mixture was mixed in the same manner as in Example 1 to obtain an adhesive, composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 5

Into a 300 ml four necked flask equipped with a stirrer, a thermometer, a nitrogen inlet tube and a dropping funnel, under a nitrogen atmosphere, were charged 104.92 g of triglyme and 15.36 g of ODPA, and the resulting mixture was stirred at 60° C. and dissolved. Thereafter, to this, 6.19 g of Elastomer 1000, 17.20 g of KF8010, 4.97 g of LP7100 and 1.90 g of NJM-06 were added while stirring at 60° C., and the resulting mixture was stirred for 1 hour. Then, the mixture was heated to 180° C. and stirred for 2 hours, and cooled to a room temperature to obtain a polyimide solution C (solid content of 30.0% by weight). The weight average molecular weight of the polyimide was determined to be 36,500 and the imidization ratio was determined to be 99%. To 48.63 g of the polyimide solution C thus obtained, ingredients shown in Table 1 were added, and the resulting mixture was mixed in the same manner as in Example 1 to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 6

To 55.5 g of the polyimide solution A obtained in Example 1, 3.75 g of HP4032, 4.58 g of JER828 and 0.8 g of 2P4MZ were added, and the resulting mixture was mixed/stirred. To this, 132 g of FAN-50, 100 g of AO509 and 25 g of MBN-010T were added, and the resulting mixture was kneaded five times with a three roll mill to form an adhesive composition which was a viscous liquid. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 7

To 48.63 g of the polyimide solution A obtained in Example 1, 2.06 g of HP4032, 8.35 g of JER828 and 0.8 g of 2P4MZ were added, and the resulting mixture was mixed/stirred. To this, 132 g of FAN-50, 100 g of AO509 and 25 g of MBN-010T were added, and the resulting mixture was kneaded five times with a three roll mill to form an adhesive composition which was a viscous liquid. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 8

To 48.63 g of the polyimide solution A obtained in Example 1, 10.41 g of JER828 and 0.8 g of 2P4MZ were added, and the resulting mixture was mixed/stirred. To this, 132 g of FAN-50, 100 g of AO509 and 25 g of MBN-010T were added, and the resulting mixture was kneaded five times with a three roll mill to form an adhesive composition which was a viscous liquid. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 9

To 48.63 g of the polyimide solution A obtained in Example 1, 10.41 g of HP4032 and 0.8 g of 2P4MZ were added, and the resulting mixture was mixed/stirred. To this, 132 g of FAN-50, 100 g of AO509 and 25 g of MBN-010T were added, and the resulting mixture was kneaded five times with a three roll mill to form an adhesive composition which was a viscous liquid. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 10

The respective ingredients were mixed in the same manner as in Example 1 except for changing the amount of FAN-50 to be added from 132 g to 148 g to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 11

The respective ingredients were mixed in the same manner as in Example 1 except for changing the amount of FAN-50 to be added from 132 g to 116 g to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 12

The respective ingredients were mixed in the same manner as in Example 1 except for changing FAN-50 to FAN-80 to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 13

The respective ingredients were mixed in the same manner as in Example 1 except for changing FAN-50 to FAN-30 to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 14

The respective ingredients were mixed in the same manner as in Example 1 except for changing 132 g of FAN-50 to be added to 160 g of DAW-45 to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 15

The respective ingredients were mixed in the same manner as in Example 1 except for changing the amount of MBN-010T to be added from 25 g to 35 g to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 16

The respective ingredients were mixed in the same manner as in Example 1 except for changing the amount of MBN-010T to be added from 25 g to 45 g to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 17

The respective ingredients were mixed in the same manner as in Example 1 except for changing 25 g of MBN-010T to be added to 40 g of AO502 to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 18

The respective ingredients were mixed in the same manner as in Example 15 except for changing the amount of AO502 to be added to 80 g to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 19

The respective ingredients were mixed in the same manner as in Example 15 except for changing the amount of AO502 to be added to 100 g to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 20

The respective ingredients were mixed in the same manner as in Example 1 except for changing the amount of FAN-50 to be added to 99 g and changing the amount of AO509 to be added to 160 g to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TOT was carried out.

Example 21

The respective ingredients were mixed in the same manner as in Example 1 except for changing the amount of FAN-50 to be added to 66 g and changing the amount of AO509 to be added to 200 g to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Example 22

To 48.63 g of the polyimide solution A obtained in Example 1, 4.16 g of HP4032, 6.25 g of JER828 and 0.8 g of 2P4MZ were added, and the resulting mixture was mixed/stirred. To this, 280 g of AO509 and 25 g of MBN-010T were added, and the resulting mixture was kneaded five times with a three roll mill to form an adhesive composition which was a viscous liquid. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Comparative Example 1

To 83.33 g of the polyimide solution A obtained in Example 1, 132 g of FAN-50, 100 g of AO509 and 25 g of MBN-010T were added, and the resulting mixture was kneaded five times with a three roll mill to form an adhesive composition which was a viscous liquid. The obtained adhesive composition was evaluated for the sticking property to a copper foil, the adhesive strength and the thermal conductivity in the above-mentioned manner, but the adhesive composition could not be stuck to the copper foil. Then, the adhesive composition was peeled off from the support film and thermally hardened on a petri dish made of "Teflon" (registered trademark), and its thermal conductivity, withstand voltage, elastic modulus and coefficient of thermal expansion were measured.

Comparative Example 2

Into a 300 ml four necked flask equipped with a stirrer, a thermometer, a nitrogen inlet tube and a dropping funnel, under a nitrogen atmosphere, were charged 112.13 g of triglyme and 10.90 g of ODPA, and the resulting mixture was stirred at 60° C. and dissolved. Thereafter, to this, 25.19 g of Elastomer 1000, 11.14 g of KF8010 and 1.52 g of BAPP were added while stirring at 60° C., and the resulting mixture was stirred for 1 hour. Then, the mixture was heated to 180° C. and stirred for 3 hours, and cooled to a room temperature to obtain a polyimide solution D (solid content of 30.0% by weight). The weight average molecular weight of the polyimide was determined to be 49,500 and the imidization ratio was determined to be 99%. To 48.63 g of the polyimide solution D thus obtained, ingredients shown in Table 3 were added, and the resulting mixture was mixed in the same manner as in Example 1 to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

Comparative Example 3

Into a 300 ml four necked flask equipped with a stirrer, a thermometer, a nitrogen inlet tube and a dropping funnel, under a nitrogen atmosphere, were charged 90.62 g of triglyme and 10.90 g of ODPA, and the resulting mixture was stirred at 60° C. and dissolved. Thereafter, to this, 25.46 g of KF8010 and 3.04 g of BAPP were added while stirring at 60° C., and the resulting mixture was stirred for 1 hour. Then, the mixture was heated to 180° C. and stirred for 3 hours, and cooled to a room temperature to obtain a polyimide solution E (solid content of 30.0% by weight). The weight average molecular weight of the polyimide was determined to be 37,500 and the imidization ratio was determined to be 99%. To 48.63 g of the polyimide solution E thus obtained, ingredients shown in Table 3 were added, and the resulting mixture was mixed in the same manner as in Example 1 to obtain an adhesive composition. The obtained adhesive composition was measured for the sticking property to a copper foil, the adhesive strength, the thermal conductivity, the withstand voltage, the elastic modulus and the coefficient of thermal expansion in the above-mentioned manner and the TCT was carried out.

The specifications given for its composition and the evaluation results of the adhesive composition obtained in each of Examples and Comparative Examples are shown in Tables 1 to 3 and Tables 4 to 6, respectively.

TABLE 1

| Item | | | Average Particle Diameter (μm) | Example 1 | Example 2 | Example 3 | Example 4 | Example 5 | Example 6 |
|---|---|---|---|---|---|---|---|---|---|
| Composition of Polyimide (molar ratio) | Tetracarboxylic Dianhydride | ODPA | | 95 | 95 | 95 | 95 | 95 | 95 |
| | Diamine of Formula (1) | Elastomer 1000 | | 45 | 45 | 30 | 20 | 10 | 45 |
| | Diamine of Formula (2) | LP7100 | | — | 10 | — | 30 | 40 | — |
| | | KF8010 | | 35 | 35 | 40 | 40 | 40 | 35 |
| | Diamine of Formula (3) | NJM-06 | | 10 | 10 | 10 | 10 | 10 | 10 |
| | Other Diamine | BAPP | | 10 | — | 20 | — | — | 10 |
| Imidization Ratio of Polyimide (%) | | | | 99 | 99 | 99 | 99 | 99 | 99 |
| Weight Average Molecular Weight of Polyimide | | | | 48200 | 44000 | 41000 | 39600 | 36500 | 48200 |
| Composition of Adhesive Resin (part by weight) | (A) Polyimide | | | 14.59 | 14.59 | 14.95 | 14.95 | 14.95 | 16.65 |
| | (B) Epoxy Resin | HP4032 | | 4.16 | 4.16 | 4.16 | 4.16 | 4.16 | 3.75 |
| | | JER828 | | 6.25 | 6.25 | 6.25 | 6.25 | 6.25 | 4.58 |
| | Hardening Agent | 2P4MZ | | 0.8 | 0.8 | 0.8 | 0.8 | 0.8 | 0.8 |
| | (C) Thermally Conductive Filler | FAN-80 | 80 | | | | | | |
| | | FAN-50 | 50 | 132 | 132 | 132 | 132 | 132 | 132 |
| | | FAN-30 | 30 | — | — | — | — | — | — |
| | | DAW-45 | 45 | — | — | — | — | — | — |
| | | AO509 | 9 | 100 | 100 | 100 | 100 | 100 | 100 |
| | | AO502 | 0.9 | — | — | — | — | — | — |
| | | MBN-010T | 0.7 | 25 | 25 | 25 | 25 | 25 | 25 |
| Polyimide/(B) Epoxy Resin | | | | 1.4 | 1.4 | 1.4 | 1.4 | 1.4 | 2.0 |
| Rate of (C-1) Filler Having Average Particle Diameter not less than 30 μm and not more than 100 μm in (C) Whole Thermally Conductive Filler (% by volume) | | | | 53 | 53 | 53 | 53 | 53 | 53 |
| Content of (C) Thermally Conductive Filler in Adhesive Composition (% by volume) | | | | 79 | 79 | 79 | 79 | 79 | 79 |

| Item | | | | Example 7 | Example 8 | Example 9 | Example 10 | Example 11 |
|---|---|---|---|---|---|---|---|---|
| Composition of Polyimide (molar ratio) | Tetracarboxylic Dianhydride | ODPA | | 95 | 95 | 95 | 95 | 95 |
| | Diamine of Formula (1) | Elastomer 1000 | | 45 | 45 | 45 | 45 | 45 |
| | Diamine of Formula (2) | LP7100 | | — | — | — | — | — |
| | | KF8010 | | 35 | 35 | 35 | 35 | 35 |
| | Diamine of Formula (3) | NJM-06 | | 10 | 10 | 10 | 10 | 10 |
| | Other Diamine | BAPP | | 10 | 10 | 10 | 10 | 10 |
| Imidization Ratio of Polyimide (%) | | | | 99 | 99 | 99 | 99 | 99 |
| Weight Average Molecular Weight of Polyimide | | | | 48200 | 48200 | 48200 | 48200 | 48200 |
| Composition of Adhesive Resin (part by weight) | (A) Polyimide | | | 14.95 | 14.95 | 14.95 | 14.95 | 14.95 |
| | (B) Epoxy Resin | HP4032 | | 2.06 | — | 10.41 | 4.16 | 4.16 |
| | | JER828 | | 8.35 | 10.41 | — | 6.25 | 6.25 |
| | Hardening Agent | 2P4MZ | | 0.8 | 0.8 | 0.8 | 0.8 | 0.8 |
| | (C) Thermally Conductive Filler | FAN-80 | | | | | | |
| | | FAN-50 | | 132 | 132 | 132 | 148 | 116 |
| | | FAN-30 | | — | — | — | — | — |
| | | DAW-45 | | — | — | — | — | — |
| | | AO509 | | 100 | 100 | 100 | 100 | 100 |
| | | AO502 | | — | — | — | — | — |
| | | MBN-010T | | 25 | 25 | 25 | 25 | 25 |
| Polyimide/(B) Epoxy Resin | | | | 1.4 | 1.4 | 1.4 | 1.4 | 1.4 |
| Rate of (C-1) Filler Having Average Particle Diameter not less than 30 μm and not more than 100 μm in (C) Whole Thermally Conductive Filler (% by volume) | | | | 53 | 53 | 53 | 56 | 49 |
| Content of (C) Thermally Conductive Filler in Adhesive Composition (% by volume) | | | | 79 | 79 | 79 | 80 | 77 |

TABLE 2

| Item | | | Average Particle Diameter (μm) | Example 12 | Example 13 | Example 14 | Example 15 | Example 16 | Example 17 |
|---|---|---|---|---|---|---|---|---|---|
| Composition of Polyimide (molar ratio) | Tetracarboxylic Dianhydride | ODPA | | 95 | 95 | 95 | 95 | 95 | 95 |
| | Diamine of Formula (1) | Elastomer 1000 | | 45 | 45 | 45 | 45 | 45 | 45 |
| | Diamine of Formula (2) | LP7100 | | — | — | — | — | — | — |
| | | KF8010 | | 35 | 35 | 35 | 35 | 35 | 35 |
| | Diamine of Formula (3) | NJM-06 | | 10 | 10 | 10 | 10 | 10 | 10 |
| | Other Diamine | BAPP | | 10 | 10 | 10 | 10 | 10 | 10 |
| Imidization Ratio of Polyimide (%) | | | | 99 | 99 | 99 | 99 | 99 | 99 |
| Weight Average Molecular Weight of Polyimide | | | | 48200 | 48200 | 48200 | 48200 | 48200 | 48200 |
| Composition of Adhesive Resin (part by weight) | (A) Polyimide | | | 14.59 | 14.95 | 14.95 | 14.95 | 14.95 | 14.95 |
| | (B) Epoxy Resin | HP4032 | | 4.16 | 4.16 | 4.16 | 4.16 | 4.16 | 4.16 |
| | | JER828 | | 6.25 | 6.25 | 6.25 | 6.25 | 6.25 | 6.25 |
| | Hardening Agent | 2P4MZ | | 0.8 | 0.8 | 0.8 | 0.8 | 0.8 | 0.8 |
| | (C) Thermally Conductive Filler | FAN-80 | 80 | 132 | — | — | — | — | — |
| | | FAN-50 | 50 | — | — | — | 132 | 132 | 132 |
| | | FAN-30 | 30 | — | 132 | — | — | — | — |
| | | DAW-45 | 45 | — | — | 160 | — | — | — |
| | | AO509 | 9 | 100 | 100 | 100 | 100 | 100 | 100 |
| | | AO502 | 0.9 | — | — | — | — | — | 40 |
| | | MBN-010T | 0.7 | 25 | 25 | 25 | 35 | 45 | — |
| | Polyimide/(B) Epoxy Resin | | | 1.4 | 1.4 | 1.4 | 1.4 | 1.4 | 1.4 |
| | Rate of (C-1) Filler Having Average Particle Diameter not less than 30 μm and not more than 100 μm in (C) Whole Thermally Conductive Filler (% by volume) | | | 53 | 53 | 53 | 50 | 47 | 53 |
| | Content of (C) Thermally Conductive Filler in Adhesive Composition (% by volume) | | | 79 | 79 | 79 | 79 | 80 | 79 |

| Item | | | Example 18 | Example 19 | Example 20 | Example 21 | Example 22 |
|---|---|---|---|---|---|---|---|
| Composition of Polyimide (molar ratio) | Tetracarboxylic Dianhydride | ODPA | 95 | 95 | 95 | 95 | 95 |
| | Diamine of Formula (1) | Elastomer 1000 | 45 | 45 | 45 | 45 | 45 |
| | Diamine of Formula (2) | LP7100 | — | — | — | — | — |
| | | KF8010 | 35 | 35 | 35 | 35 | 35 |
| | Diamine of Formula (3) | NJM-06 | 10 | 10 | 10 | 10 | 10 |
| | Other Diamine | BAPP | 10 | 10 | 10 | 10 | 10 |
| Imidization Ratio of Polyimide (%) | | | 99 | 99 | 99 | 99 | 99 |
| Weight Average Molecular Weight of Polyimide | | | 48200 | 48200 | 48200 | 48200 | 48200 |
| Composition of Adhesive Resin (part by weight) | (A) Polyimide | | 14.95 | 14.95 | 14.95 | 14.95 | 14.95 |
| | (B) Epoxy Resin | HP4032 | 4.16 | 4.16 | 4.16 | 4.16 | 4.16 |
| | | JER828 | 6.25 | 6.25 | 6.25 | 6.25 | 6.25 |
| | Hardening Agent | 2P4MZ | 0.8 | 0.8 | 0.8 | 0.8 | 0.8 |
| | (C) Thermally Conductive Filler | FAN-80 | — | — | — | — | — |
| | | FAN-50 | 132 | 132 | 99 | 66 | — |
| | | FAN-30 | — | — | — | — | — |
| | | DAW-45 | — | — | — | — | — |
| | | AO509 | 100 | 100 | 160 | 200 | 280 |
| | | AO502 | 80 | 100 | — | — | — |
| | | MBN-010T | — | — | 25 | 25 | 25 |
| | Polyimide/(B) Epoxy Resin | | 1.4 | 1.4 | 1.4 | 1.4 | 1.4 |
| | Rate of (C-1) Filler Having Average Particle Diameter not less than 30 μm and not more than 100 μm in (C) Whole Thermally Conductive Filler (% by volume) | | 47 | 44 | 37 | 25 | 0 |
| | Content of (C) Thermally Conductive Filler in Adhesive Composition (% by volume) | | 80 | 81 | 80 | 80 | 80 |

TABLE 3

| Item | | | Average Particle Diameter (μm) | Comparative Example 1 | Comparative Example 2 | Comparative Example 3 |
|---|---|---|---|---|---|---|
| Composition of Polyimide (molar ratio) | Tetracarboxylic Dianhydride | ODPA | | 95 | 95 | 95 |
| | Diamine of Formula (1) | Elastomer 1000 | | 45 | 55 | — |

TABLE 3-continued

| Item | | | Average Particle Diameter (μm) | Comparative Example 1 | Comparative Example 2 | Comparative Example 3 |
|---|---|---|---|---|---|---|
| | Diamine of Formula (2) | LP7100 | | — | — | — |
| | | KF8010 | | 35 | 35 | 80 |
| | Diamine of Formula (3) | NJM-06 | | 10 | — | — |
| | Other Diamine | BAPP | | 10 | 10 | 20 |
| Imidization Ratio of Polyimide (%) | | | | 99 | 99 | 99 |
| Weight Average Molecular Weight of Polyimide | | | | 48200 | 49500 | 37500 |
| Composition of Adhesive Resin (part by weight) | (A) Polyimide | | | 25 | 14.95 | 14.95 |
| | (B) Epoxy Resin | HP4032 | | — | 4.16 | 4.16 |
| | | JER828 | | — | 6.25 | 6.25 |
| | Hardening Agent | 2P4MZ | | — | 0.8 | 0.8 |
| | (C) Thermally Conductive Filler | FAN-80 | 80 | — | — | — |
| | | FAN-50 | 50 | 132 | 132 | 132 |
| | | FAN-30 | 30 | — | — | — |
| | | DAW-45 | 45 | — | — | — |
| | | AO509 | 9 | 100 | 100 | 100 |
| | | AO502 | 0.7 | — | — | — |
| | | MBN-010T | 0.9 | 25 | 25 | 25 |
| Polyimide/(B) Epoxy Resin | | | | 0 | 1.4 | 1.4 |
| Rate of (C-1) Filler Having Average Particle Diameter not less than 30 μm and not more than 100 μm in (C) Whole Thermally Conductive Filler (% by volume) | | | | 53 | 53 | 53 |
| Content of (C) Thermally Conductive Filler in Adhesive Composition (% by volume) | | | | 79 | 79 | 79 |

TABLE 4

| Item | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| Sticking Property to Copper Foil | ○ | ○ | ○ | ○ | ○ | ○ | ○ | ○ | ○ | ○ | ○ |
| Adhesive Strength (N/cm) | 3.0 | 3.0 | 3.0 | 2.8 | 2.5 | 3.0 | 3.5 | 4.0 | 2.0 | 3.0 | 3.0 |
| Thermal Conductivity (W/mK) | 11 | 11 | 11 | 11 | 11 | 11 | 11 | 11 | 11 | 13 | 9 |
| Withstand Voltage (kV) | >5.0 | >5.0 | >5.0 | >5.0 | >5.0 | >5.0 | >5.0 | >5.0 | >5.0 | >5.0 | >5.0 |
| Elastic Modulus (GPa)  −45° C. | 27 | 26 | 25 | 26 | 28 | 25 | 29 | 32 | 26 | 28 | 28 |
| 25° C. | 12 | 11 | 9 | 11 | 13 | 8 | 12 | 12 | 12 | 12 | 11 |
| 125° C. | 3 | 3 | 1 | 2 | 3 | 2 | 2 | 0.8 | 5 | 3 | 3 |
| Coefficient of thermal expansion (ppm) | 23 | 21 | 24 | 21 | 18 | 24 | 25 | 27 | 16 | 21 | 23 |
| TCT Test (−45° C. to 125° C., 1000 cycles) | ○ | ○ | ○ | ○ | ○ | ○ | ○ | ○ | ○ | ○ | ○ |

TABLE 5

| Item | Example 12 | Example 13 | Example 14 | Example 15 | Example 16 | Example 17 | Example 18 | Example 19 | Example 20 | Example 21 | Example 22 |
|---|---|---|---|---|---|---|---|---|---|---|---|
| Sticking Property to Copper Foil | ○ | ○ | ○ | ○ | ○ | ○ | ○ | ○ | ○ | ○ | ○ |
| Adhesive Strength (N/cm) | 3.0 | 3.0 | 3.0 | 2.5 | 2.0 | 4.5 | 4.5 | 4.0 | 3.5 | 3.5 | 3.5 |
| Thermal Conductivity (W/mK) | 13 | 9 | 8 | 11 | 11 | 9 | 9 | 9 | 10 | 8 | 5 |
| Withstand Voltage (kV) | >5.0 | >5.0 | >5.0 | >5.0 | >5.0 | >5.0 | >5.0 | >5.0 | >5.0 | >5.0 | >5.0 |
| Elastic Modulus (GPa)  −45° C. | 27 | 27 | 29 | 26 | 25 | 31 | 32 | 32 | 30 | 31 | 32 |
| 25° C. | 12 | 12 | 12 | 11 | 10 | 13 | 13 | 13 | 12 | 13 | 11 |
| 125° C. | 3 | 3 | 3 | 3 | 3 | 3 | 3 | 3 | 3 | 3 | 3 |
| Coefficient of thermal expansion (ppm) | 17 | 24 | 22 | 21 | 19 | 22 | 19 | 16 | 22 | 22 | 21 |
| TCT Test (−45° C. to 125° C., 1000 cycles) | ○ | ○ | ○ | ○ | ○ | ○ | ○ | ○ | ○ | ○ | ○ |

TABLE 6

| Item | Comparative Example 1 | Comparative Example 2 | Comparative Example 3 |
|---|---|---|---|
| Sticking Property to Copper Foil | x | ○ | ○ |
| Adhesive Strength (N/cm) | 0.0 | 3.0 | 2.0 |
| Thermal Conductivity (W/mK) | 10 | 11 | 11 |
| Withstand Voltage (kV) | >5.0 | 2.2 | 1.9 |

TABLE 6-continued

| Item | | Comparative Example 1 | Comparative Example 2 | Comparative Example 3 |
|---|---|---|---|---|
| Elastic Modulus (GPa) | −45° C. | 20 | 40 | 38 |
| | 25° C. | 3 | 17 | 16 |
| | 125° C. | 0.1 | 0.8 | 1 |
| Thermal Expansion Coefficient (ppm) | | 65 | 35 | 32 |
| TCT Test (−45° C. to 125° C., 1000 cycles) | | — | x | x |

The invention claimed is:

1. An adhesive composition containing an organic-solvent-soluble polyimide (A), an epoxy resin (B) and a thermally conductive filler (C), wherein the organic-solvent-soluble polyimide (A) contains a diamine residue having a structure represented by the following general formula (1), a diamine residue represented by the following general formula (2) and a diamine residue represented by the following general formula (3), and the content of the epoxy resin (B) is not less than 30 parts by weight and not more than 100 parts by weight with respect to 100 parts by weight of the organic-solvent-soluble polyimide (A):

(1)

in the general formula (1), X represents an integer of 1 to 10 and n represents an integer of 1 to 20;

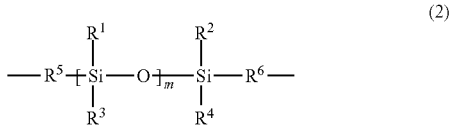
(2)

in the general formula (2), m represents an integer of 1 to 30, and $R^5$ and $R^6$ may be the same or different and represent an alkylene group having 1 to 30 carbon atoms or a phenylene group, $R^1$ to $R^4$ each may be the same or different and represent an alkyl group having 1 to 30 carbon atoms, a phenyl group or a phenoxy group;

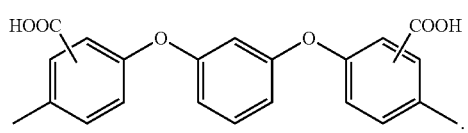
(3)

2. The adhesive composition according to claim 1, wherein
the content of the diamine residue having a structure represented by the general formula (1) is 30% by mole or more in all the diamine residues,
the content of the diamine residue represented by the general formula (2) is 10% by mole or more in all the diamine residues, and
the content of the diamine residue represented by the general formula (3) is 5% by mole or more in all the diamine residues.

3. The adhesive composition according to claim 1, wherein the epoxy resin (B) has a skeleton represented by the following general formula (4):

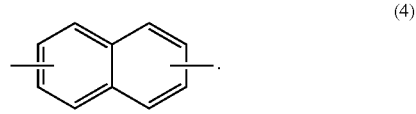
(4)

4. The adhesive composition according to claim 1, wherein the content of the thermally conductive filler (C) is not less than 60% by volume and not more than 90% by volume in the adhesive composition.

5. The adhesive composition according to claim 1, wherein the thermally conductive filler (C) contains three types of thermally conductive fillers differing in the average particle diameter, a thermally conductive filler (C-1), a thermally conductive filler (C-2) and a thermally conductive filler (C-3), and
when average particle diameters of the thermally conductive fillers (C-1), (C-2) and (C-3) are denoted by d1, d2 and d3, respectively, an average particle diameter ratio d1/d2 is not less than 1.5 and not more than 15 and an average particle diameter ratio d2/d3 is not less than 1.5 and not more than 15.

6. The adhesive composition according to claim 5, wherein the average particle diameter d3 of the thermally conductive filler (C-3) is 2 μm or less.

7. The adhesive composition according to claim 5, wherein the thermally conductive filler (C-1) is aluminum nitride.

8. The adhesive composition according to claim 5, wherein the content of the thermally conductive filler (C-1) is not less than 40% by volume and not more than 80% by volume in the whole thermally conductive fillers (C).

9. A adhesive sheet obtained by forming the adhesive composition according to claim 1 into a sheet.

10. A layered product including an adhesive layer and a radiating fin made of a metallic substrate, wherein the adhesive layer is formed by adhering the adhesive sheet according to claim 9 to the radiating fin.

11. A power IC packaging which is obtained by bonding the layered product according to claim 10 by way of thermocompression to a lead frame, which is made of copper, of a semiconductor device having the power IC mounted thereon.

12. A layered product including an adhesive layer and a radiating fin made of a metallic substrate, wherein the adhesive layer is formed by applying a varnish of the adhesive composition according to claim 1 onto the radiating fin and drying the varnish.

13. A power IC packaging which is obtained by bonding the layered product according to claim 12 by way of thermocompression to a lead frame, which is made of copper, of a semiconductor device having the power IC mounted thereon.

14. The power IC packaging according to claim 13, wherein the power IC is Si semiconductor or SiC semiconductor.

15. A hardened article obtained by hardening an adhesive composition containing an organic-solvent-soluble polyimide (A), an epoxy resin (B) and a thermally conductive filler (C),
wherein the organic-solvent-soluble polyimide (A) contains a diamine residue having a structure represented by the following general formula (1), a diamine residue represented by the following general formula (2) and a diamine residue represented by the following general formula (3), and the content of the epoxy resin (B) is not less than 30 parts by weight and not more than 100 parts by weight with respect to 100 parts by weight of the organic-solvent-soluble polyimide (A):

(1)

in the general formula (1), X represents an integer of 1 to 10 and n represents an integer of 1 to 20;

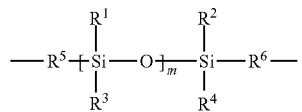

(2)

in the general formula (2), m represents an integer of 1 to 30, and $R^5$ and $R^6$ may be the same or different and represent an alkylene group having 1 to 30 carbon atoms or a phenylene group, $R^1$ to $R^4$ each may be the same or different and represent an alkyl group having 1 to 30 carbon atoms, a phenyl group or a phenoxy group;

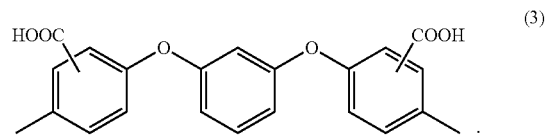

(3)

16. A semiconductor device including the hardened article according to claim 15.

* * * * *